United States Patent [19]

Kengeri et al.

[11] Patent Number: 5,831,315

[45] Date of Patent: Nov. 3, 1998

[54] HIGHLY INTEGRATED LOW VOLTAGE SRAM ARRAY WITH LOW RESISTANCE VSS LINES

[75] Inventors: Subramani Kengeri, San Jose; Chitranjan N. Reddy, Los Altos Hills, both of Calif.

[73] Assignee: Alliance Semiconductor Corporation, San Jose, Calif.

[21] Appl. No.: 795,062

[22] Filed: Feb. 5, 1997

[51] Int. Cl.[6] .......................... H01L 29/76; H01L 29/94; H01L 31/062; H01L 31/113

[52] U.S. Cl. ............................................................ 257/393

[58] Field of Search .................................... 257/903, 393

[56] References Cited

U.S. PATENT DOCUMENTS

| | | | |
|---|---|---|---|
| 4,125,854 | 11/1978 | McKenny et al. | 357/41 |
| 4,554,644 | 11/1985 | Chen et al. | 365/154 |
| 4,631,705 | 12/1986 | Honda | 365/182 |
| 5,005,068 | 4/1991 | Ikeda et al. | 357/59 |
| 5,483,083 | 1/1996 | Meguro et al. | |
| 5,521,860 | 5/1996 | Ohkubo | 365/154 |

*Primary Examiner*—Stephen Meier
*Attorney, Agent, or Firm*—Abdy Raissinia

[57] ABSTRACT

An SRAM array configuration is disclosed. SRAM cells (102) are arranged in rows and columns. Cell rows (104a–104f) are each driven by a particular word line (132). Cell row pairs (108a and 108b) are supplied with a low power supply voltage (Vss) by a number of Vss connections 116 disposed parallel to the cell rows (104a–104f). The word lines (132) and Vss connections 116 are "strapped" by low resistance word line straps (110b–110e) and Vss straps (112a–112b). Both the word line straps (110b–110e) and the Vss straps (112a–112b) are substantially offset with respect to their associated word lines (132) and Vss connections 116, respectively. The Vss strap offset is accomplished with the use of a Vss line 140 that makes contact with the Vss connections 116 and further includes landing portions 120 which extend in the column direction and make contact with the Vss straps (112a–112b).

28 Claims, 4 Drawing Sheets

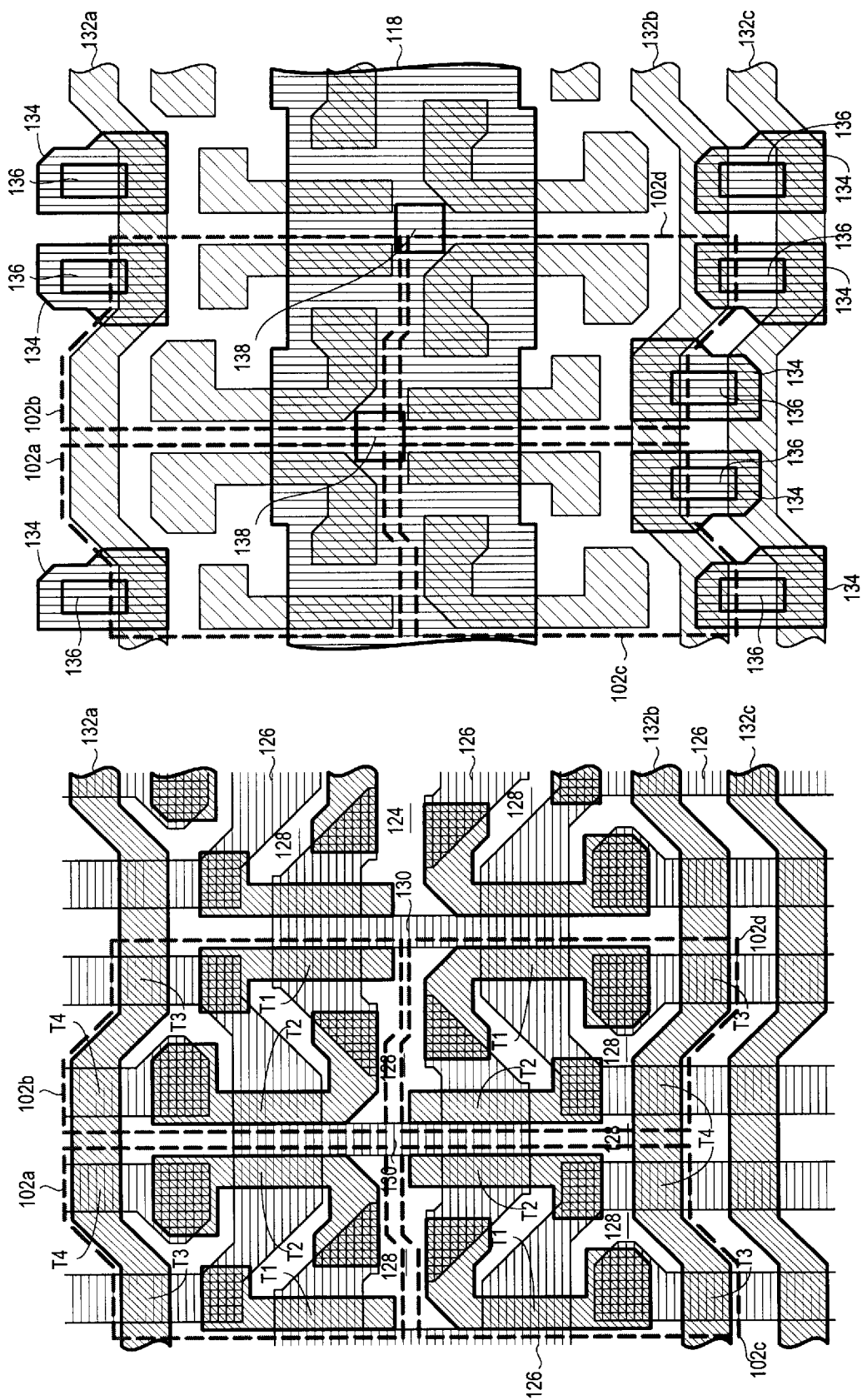

HIGHLY INTEGRATED LOW VOLTAGE SRAM ARRAY WITH LOW RESISTANCE VSS LINES

TECHNICAL FIELD

The present invention relates generally to semiconductor memory devices, and more particularly to an array configuration for a static random access memory (SRAM) integrated circuit device.

BACKGROUND OF THE INVENTION

Static random access memories (SRAMs) typically include one or more arrays of memory cells, with each cell including a pair of cross-coupled active storage devices. The storage devices are typically transistors, for example insulated gate field effect transistors (referred to herein as "MOS" transistors). Each cross-coupled pair is disposed between opposite power supply nodes and can be latched in one of two states depending upon which of the two storage devices is turned on. The cross-coupled arrangement results in complementary signals at two data nodes, both (or one) of which can be read to a pair of bit lines (or single bit line) by another pair of access active devices. The access devices are usually driven by a word line. Commonly, in addition to the two cross-coupled storage devices and two access devices, current limiting devices are also provided to reduce the amount of current consumed by the "on" storage device. One current limiting devices is situated between each storage device and one of the power supply nodes. The above SRAM cell approaches has given rise to "four transistor" (4-T) memory cells and "six transistor" (6-T) memory cells. In the case of 4-T cells, the current limiting devices are typically resistors. For 6-T cells, the current limiting devices are typically another pair of active devices.

The memory cells of conventional SRAM arrays are arranged in rows and columns. Cells within the same row have access devices driven by the same word line. Cells within the same column are coupled to the same bit lines. When a word line is activated, the access devices couple the data nodes to bit lines, which in turn, provide output data in a read operation, or are driven by write data in a write operation.

The increasing integration of SRAM arrays has led to arrays having columns and rows composed of many cells. The increasing array sizes result in longer and longer word lines, which must span the entire array and drive the many cells of a row. In addition, longer and longer power supply lines must also be provided to span the array and provide the opposing power supply nodes necessary for the latching action within the memory cells. Diffused power supply lines (i.e., those formed in the substrate) are no longer feasible, due to the inherent resistance of such structures. In addition, such structure can consume valuable substrate area. It is known in the prior art to provide doped polysilicon (or combination doped polysilicon/refractory silicide) power supply lines. Such structures can also introduce an undesirable resistance drop for particularly large arrays, however.

To overcome the above discussed word line problems, it is known in the prior art to provide low resistance metal word line "straps." Such structures typically span the area over their respective word line, and make periodic contact therewith. In the case of power supply lines, it is known in the prior art to provide low resistance power supply lines that span the array and make periodic contact with respective power supply contacts of the cells.

A problem associated with SRAM arrays employing both word line straps in combination with power supply lines is aligning the power supply lines over the power supply connections of the their respective cells. The minimum spacing requirements of the upper layers may constrain the placement of the underlying layers, including the cells. This results in SRAM arrays of less than optimal compactness.

U.S. Pat. No. 4,554,644 issued to Chen et al. on Nov. 18, 1985 discloses a 4-T SRAM cell array wherein a low power supply (Vss) is supplied to the memory cells by a Vss line formed from a low resistance first polysilicon/silicide layer running in the word line direction of the array. In addition, a low resistance high power supply (Vcc) line is formed over the Vss line that also runs in the word line direction of the array. The Vcc line is formed from polysilicon, includes integral impedance devices, and low resistance, highly doped sections. Chen et al. also provides a discussion of the problems resulting from resistance drops in Vss lines.

U.S. Pat. No. 6,631,705 issued to Masahiko Honda on Dec. 23, 1986 discloses a 4-T SRAM cell wherein a dual Vss line approach (two Vss line connections per SRAM cell) is abandoned for a single, metal Vss line which runs in the word line direction of the array. Honda also describes a word line strapping structure, wherein polysilicon word lines are coupled to a parallel metal word line at regular cell intervals along the array word line direction.

U.S. Pat. No. 5,521,860 issued to Hiroaki Ohkubo on May 28, 1992 discloses a 6-T SRAM cell wherein Vcc and Vss are supplied to the cell by two Vss lines and one Vcc line formed from silicide, that run in the word line direction of the array.

U.S. Pat. No. 5,005,068 issued to Ikeda et al. on Apr. 2, 1991 discloses a 4-T SRAM cell wherein a relatively wide Vss line is formed from metal over a second polysilicon Vcc line. In addition, metal word lines, for strapping polysilicon word lines, are formed from the same layer as the Vss line.

Commonly owned, copending U.S. patent application Ser. No. 08/615,004 discloses an SRAM array having a serpentine Vcc line.

It would be desirable to provide an SRAM array wherein the minimum spacing requirements of overlying power supply lines do not limit the placement and/or arrangement of the underlying layers and structure.

SUMMARY OF THE INVENTION

It is an object of the present invention to provide a memory cell array arrangement having word line straps and at least one power supply strap wherein the placement of the power supply strap is not dependent upon being aligned with the underlying memory cells.

It is another object of the present invention to provide an SRAM array with a high degree of integration.

It is another object of the present invention to provide a compact SRAM array with at least one power supply line which incurs a minimal resistance drop across the array.

According to the present invention an SRAM array is provided having rows and columns of memory cells. Data stored within the memory cells is coupled to bit lines by a number of word lines, each corresponding to one particular row. The word lines span across substantially the entire array, parallel to the rows. The memory cells of adjacent row pairs share a number of first power supply connections. Parallel to the word lines are first power supply lines, each first power supply line being coupled to the first power supply connections of its respective row pair. The first power supply lines also include landing portions that extend in the column direction, offset from the first power supply connections. A word line strap is provided for each word line to provide for rapid activation of the word line. A first power supply strap is provided for each first power supply line to provide a potential to the memory cells with minimal resistance drop. The landing portions of the first power supply lines enable the first power supply straps to be offset from the first power supply connections of the cells.

According to one aspect of the present invention second power supply lines are provided, each line corresponding to adjacent row pairs, and being disposed over and parallel to first power supply lines. The second power supply lines include current limiting devices that extend in the column direction past the first power supply landing portions and make contact with the memory cells.

According to another aspect of the present invention, two word line straps and one first power supply strap are associated with each adjacent pair of memory cell rows, the word line straps of each row being offset with respect to one of the underlying rows, the first power supply strap being offset with respect to the other of the underlying rows.

According to another aspect of the present invention the word line straps and first power supply straps are formed from the same conductive layer.

An advantage of the present invention is that it provides an SRAM array having word line straps, first power supply lines, and first power supply straps, wherein there is greater flexibility in the placement of the first power supply straps and/or the word line straps.

Another advantage of the present invention it provides an SRAM array wherein first and second power supply lines common to row pairs are formed over one another, with the first power supply still being accessible for a first power supply strap.

Other objects and advantages of the present invention will become apparent in light of the following description thereof.

BRIEF DESCRIPTION OF THE DRAWINGS

FIGS. 4a–4c are top plan views illustrating the arrangement of the various conductive layers of the preferred embodiment.

DETAILED DESCRIPTION OF THE EMBODIMENTS

The preferred embodiment of the present invention is a static random access memory (SRAM) cell array composed of four transistor (4-T) cells. The present invention is intended to be implemented as multiple arrays in an SRAM integrated circuit.

Figure 1:
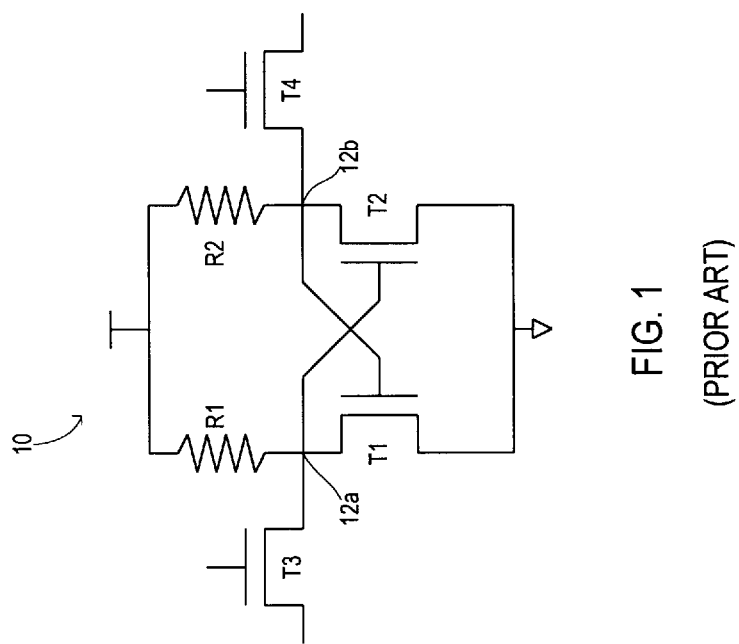
FIG. 1 is a schematic diagram illustrating the prior art four transistor memory cell utilized in the preferred embodiment of the present invention.

Referring now to FIG. 1, the prior art 4-T cell is illustrated in a schematic diagram view. The 4-T cell is designated by the general reference character 10. N-channel MOS (NMOS) transistors T1 and T2 are cross-coupled storage devices that form a latching structure. The drains of T1 and T2 form complementary data nodes 12a and 12b. The data nodes (12a and 12b) are coupled to bit lines (not shown in FIG. 1) by access devices NMOS transistors T3 and T4. As is well-known in the art, the gates of T3 and T4 are commonly driven by a word line (not shown). The sources of T1 and T2 are commonly coupled to a first power supply, Vss (ground), while the data nodes are coupled to a second power supply, Vcc, by way of current limiting devices (resistors R1 and R2).

Figure 2:
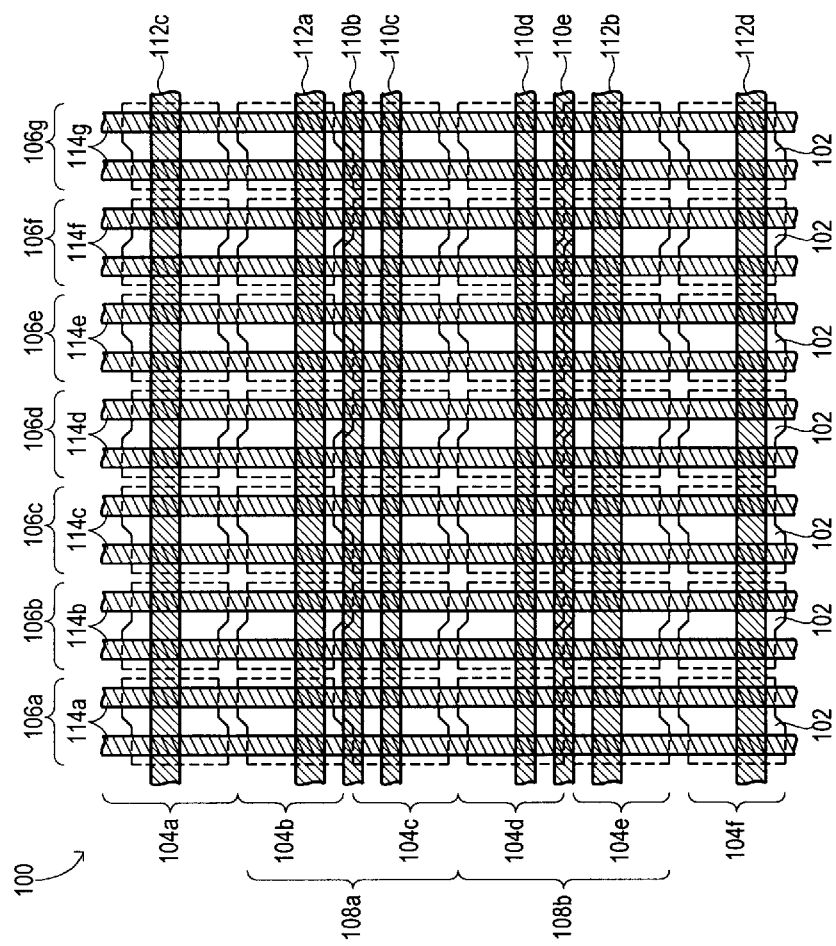
FIG. 2 is a top plan view illustrating the word line strapping and Vss power supply strapping arrangement of the preferred embodiment.

Referring now to FIG. 2, an SRAM array according to the present invention is set forth in a top plan view. The SRAM array is designated by the general reference character 100 and includes 42 memory cells 102 arranged in six rows (104a–104f) and seven columns (106a–106g). The peripheral edges of the memory cells 102 are indicated by dashed lines in FIG. 2. The rows (104a–104f) can be further conceptualized as being arranged into adjacent row pairs (108a and 108b), with rows 104b and 104c being one row pair 108a and rows 104d and 104e being another row pair 108b. It is understood that that row 104a could form a row pair with an adjacent row above it (not shown in FIG. 2) and that row 104f could form a row pair with an adjacent row below it (also not shown in FIG. 2). In the preferred embodiment, row pairs (108a and 108b) share both low power supply (Vss) connections and high power supply (Vcc) connections. The Vss connections run parallel and between the rows. For example, in FIG. 2, the Vss connections for row pair 108a would run in the horizontal direction generally between the memory cells 102 of rows 104b and 104c, while the Vss connections for row pair 108b would be situated generally between the cells 102 of rows 104d and 104e.

The word line and Vss power supply strapping arrangement of a preferred embodiment of the present invention is set forth in detail in FIG. 2. A number of word line strap members (110b–110e) are formed on a layer above the word lines of the rows. In FIG. 2, word line strap members 110b–110e correspond to the word lines of rows 104b–104e, respectively. The word line strap members (110b–110e) span substantial portions of the array and are coupled to their respective word lines 104b–104e, at another location within the array (not shown). In the preferred embodiment, this is accomplished by a number of conductive vias.

Formed from the same layer as the word line straps (110b–110e) are a number of Vss straps (112a–112d). Each Vss strap corresponds to the Vss connections of a given row pair. In the particular embodiment of FIG. 2, Vss straps 112a and 112b correspond to the Vss connections of row pairs 108a and 108b, respectively. Vss strap 112c could correspond to the Vss connections of a row pair that includes row 104a, while Vss strap 112d could correspond to the Vss connections of a row pair that includes row 104f. Referring now particularly to row pairs 108a and 108b, it is shown that the SRAM array arrangement of the present invention allows for considerable offset of the Vss straps (112a–112d) from their respective underlying Vss connections. For example, in the preferred embodiment of FIG. 2, while the Vss connections of row pair 108a are generally located between rows 104b and 104c, the Vss strap 112a corresponding to the Vss connections is disposed over row 104b. Similarly, while the Vss connections for row pair 108b are generally located between rows 104d and 104e, the corresponding Vss strap 112b is situated generally over row 104e. The word line strap members (110b–110e) are also considerably offset from their respective word lines. For example, in the preferred embodiment of FIG. 2, word line straps 110c and 110d are situated generally over the center of the cells of their respective rows (104c and 104d), while word lines straps 110b and 110e are situated generally between the rows of their respective row pairs (108a and 108b) instead of over their corresponding rows (104b and 104e).

Also set forth in FIG. 2 are a number of bit line pairs 114a–114g, each corresponding to a column 106a–106g, respectively. The bit line pairs (114a–114g) run in the column direction and make contact with the cells 102 of their respective column. Contact between cells 104 and the bit lines (114a–114g), in the preferred embodiment, is via bit line contacts. The bit line contacts (not shown in FIG. 2) are situated between the row pairs. In FIG. 2, the bit line contacts would run in a generally horizontal direction between rows 104a and 104b, between rows 104c and 104d, and between rows 104e and 104f. In the particular embodiment disclosed, the bit lines (114a–114g) are formed over (on a layer deposited subsequent to) the word line straps (110a–110e) and Vss straps (112a–112d).

Figure 3:
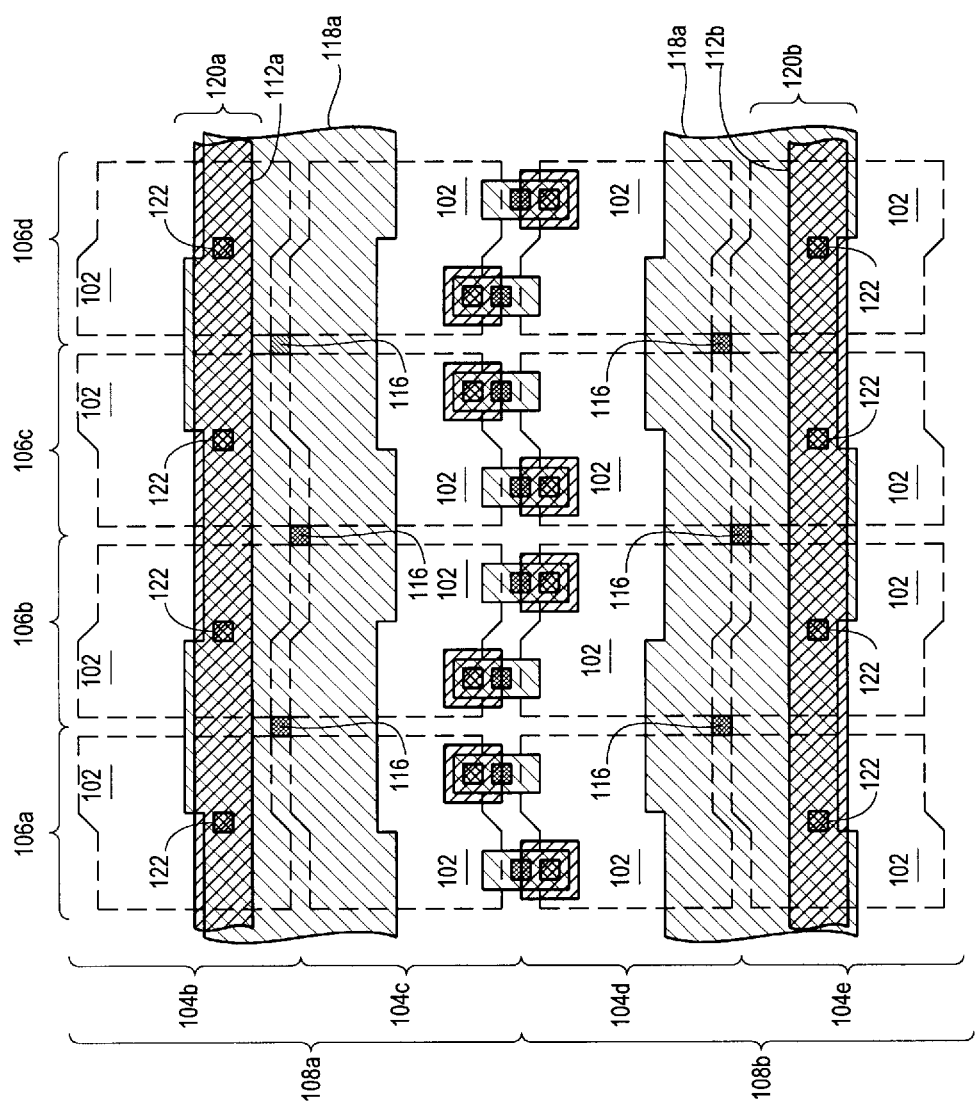
FIG. 3 is a top plan view illustrating the Vss power supply arrangement of the preferred embodiment.

Referring now to FIG. 3, the lower layers of the SRAM array 100 according to the preferred embodiment, are set forth in detail. Four cells rows (104b–104e) and four cell columns (106a–106d) are set forth for a total of 16 memory cells 102. The memory cells 102 are each designated by a dashed outline. As previously described, situated generally between rows 104b and 104c, and running generally in the row direction, are a number of Vss connections 116. In the preferred embodiment, the Vss connections 116 are shared at the intersection of four adjacent cells 102 between each column (106a–106d) of the array. Also illustrated in FIG. 3 is the preferred embodiment arrangement wherein the Vss straps (112a and 112b) are shared by row pairs (108a and 108b). The Vss connections 116 are supplied with the Vss voltage by the combination of Vss straps (112a and 112b) and Vss lines (118a and 118b). The Vss lines (118a and 118b) run in the row direction, between the rows of each row pair (108a and 108b). Vss line 118a provides the Vss reference voltage to the row pair 108a by way of the Vss connections 116 of that row pair (i.e., those Vss connections between rows 104b and 104c). Similarly, Vss line 118b provides the Vss voltage to row pair 108b by way of the Vss connections of row pair 108b. In the preferred embodiment, the Vss connections 116 are diffusion regions shared by their corresponding adjacent four cells 102. The Vss lines (118a and 118b) are formed from a second layer of doped polysilicon (poly 2) and are connected to the Vss connections 116 by way of a poly 2-substrate contact. One skilled in the art could employs other substrate contacting approaches, such as "plugs" vias formed from tungsten, or the like.

Figure 4C:
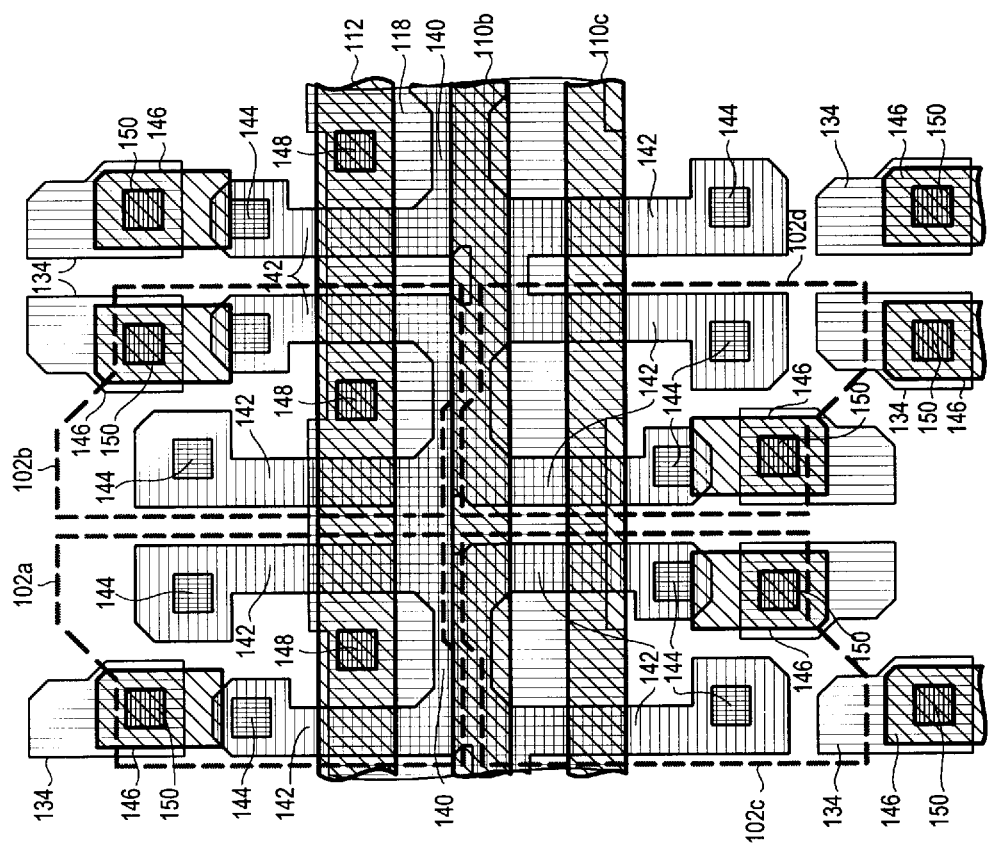

As set forth in FIG. 3, each Vss line (118a and 118b) has a relatively large width, and extends in the column direction away from its respective Vss connections 116. For example, a portion of Vss line 118a, referred to herein as a "landing" portion and labelled as 120a, overlaps the cells of row 104b. Similarly, Vss line 118b includes landing portion 120b that overlaps the cells of row 104e. It is the landing portion (120a and 120b) of each Vss line (118a and 118b) which allow for the substantial offset of the Vss line straps (112a and 112b) in the column direction. By providing Vss lines (118a and 118b) with landing portions (120a and 120b) the placement of the Vss straps is not constrained by the location of the Vss connections 116. As shown in the figure, rather than having to align the Vss straps (112a and 112b) over the Vss connections 116, the Vss straps (112a and 112b) make contact with the Vss lines (118a and 118b) on the landing portions (120a and 120b). In the preferred embodiment, the Vss straps (112a and 112b) are formed from a first layer of metallization, and make contact with their respective Vss line (118a and 118b) by way of a series of metal-poly 2 contacts 122. FIGS. 4a–4c provide a detailed illustration of the SRAM array according to the preferred embodiment by providing top plan views of the various layers for four adjacent cells in the array.

Referring to FIG. 4a, the substrate and first conductive layer of four SRAM cells are set forth in detail. The four cells (102a–102d), identified by surrounding dashed lines, are formed in a semiconductor substrate 124. It is noted that for the purposes of this discussion the memory cells (102a–102d) will be identified as including the four transistors of the 4-T cell design, but excluding the resistors (which will be shown in a subsequent figure). According to well understood semiconductor device techniques, the substrate 124 includes "active areas" 126, designated by horizontal hatching, and isolation regions 128, designated by non-hatched regions.

A first conductive layer, designated by 45 degree hatching, is patterned over the substrate 124, to form cross-coupled storage NMOS transistors T1 and T2, identified by their respective gates. In addition, access NMOS transistors T3 and T4, are also formed, and are identified in FIG. 3 by their respective gates. Vss diffusion areas 130, corresponding to Vss connections 116, are shared by four storage transistors in four adjacent cells. Transistors T1 and T2 are cross coupled to one another by way of buried contacts coupling the patterned poly 1 layer to appropriate active areas 126. The buried contacts are designated by grid hatching. The gates of the access transistors (T3 and T4) are integrally formed with the word lines (132a–132c) of their respective rows. Word line 132a couples the data in cells 102a and 102b to bit lines (not shown) and word line 132b couples the data in cells 102c and 102d to bit lines (also not shown). In the preferred embodiment, the first conductive layer is a first layer of doped polysilicon (poly 1).

Referring now to FIG. 4b, the first conductive layer and a second conductive layer of the four SRAM cells (102a–102d) are set forth in detail. The first conductive layer, illustrated by 45 degree hatching, is included to provide reference to the second conductive layer, illustrated by vertical hatching. In the preferred embodiment, two structures are formed by the second conductive layer; a Vss line 118, and a number of bit line contact landing pads 134. The bit line contact landing pads 134 each make contact with one terminal of an access devices (transistor T3 or T4) by way of bit line contacts 136. In addition, each bit line contact landing pad 134 includes a landing portion that extends in the column direction to overlap the word line (132a–132c) of its respective access transistor (T3 or T4). As previously described in conjunction with FIG. 3, the Vss line 118 is coupled to the Vss diffusion areas 130 by way of Vss contacts 138. In the preferred embodiment, the second conductive layer is a second layer of doped polysilicon (poly 2). Accordingly, both the bit line contacts 136 and the Vss contacts 138 are poly 2-substrate contacts.

Referring now to FIG. 4c, the second, a third and a fourth conductive layer of the four SRAM cells (102a–102d) are set forth in detail. The second conductive layer, illustrated by vertical hatching, is included to provide reference to the third and fourth conductive layers. The third conductive layer is indicated by horizontal hatching and includes a Vcc line 140 and a number of resistors 142. The Vcc line 140 is shown to be formed over the Vss line 118 and extends parallel, and generally between cell rows. The resistors 142 are an integral portion of the Vcc line 140 and are shown to extend in the column direction away from the Vcc line 140, with two resistors 142 making contact with each cell 102a–102d. The contact is made by way of resistor contacts 144. The resistors contacts 144 couple one resistor to each of the data nodes formed by the cross coupled devices. In the preferred embodiment, the third conductive layer is a third layer of polysilicon (poly 3) and the resistor contacts 144 are poly 3-poly 1 vias.

The fourth conductive layer of FIG. 4c, is indicated by 45 degree hatching and includes the Vss strap 112 associated with the Vss line 118, as well as two word line straps 110b and 110c. In addition, bit line landing pads 146 are also formed. As previously noted in conjunction with FIG. 3, the Vss strap 112 is offset with respect to its underlying Vss contacts, and extends over the cell row that includes cells 102a and 102b. The Vss strap 112 makes contact with the Vss line 118 by the Vss vias 148. As set forth in the figure, the Vss vias 148 are situated between the resistors 142 of each cell. This provides for a highly integrated design, with a reliable Vss supply. One skilled in the art would recognize that the particular frequency of Vss vias 148 set forth in FIG. 4c should not be construed as limiting the present invention thereto. It is also noted that word line strap 110b is likewise offset, and corresponds to the word line of cells 102a and 102b. Word line strap 110c is also offset, to a lesser extent, from its respective word line (word line 132b in FIGS. 4a and 4b). The bit line landing pads 146 each correspond to one bit line contact landing pad 134 and are connected thereto by a bit line contact via 150. One skilled in the art would recognize that the combination of bit line contact landing pads 134 and bit line landing pads 146 provides greater flexibility in the placement of the bit line contacts. Instead of having to connect bit line contacts directly to the active regions next to the word lines, the bit line contacts can be dropped to the bit line landing pads 146, which are substantially offset from their respective word lines. In the preferred embodiment the fourth conductive layer is formed from a first metallization layer (metal 1). Accordingly, the Vss vias 148 and bit line contact vias 150 are metal 1-poly 2 vias.

While the preferred embodiment is intended to be utilized in an SRAM integrated circuit device, it is understood that the teaching presented herein could be employed in other devices, such as first-in-first-out (FIFO) buffers and logic arrays, or the like. It is understood that the embodiments set forth herein are only some of the possible embodiments of the present invention, and that the invention may be changed, and other embodiments derived, without departing from the spirit and scope of the invention. Accordingly, the invention is intended to be limited only by the appended claims.

What is claimed is:

1. A static random access memory array, comprising:
   a plurality of memory cells formed in two adjacent rows, the rows extending in a first direction, and including power supply contacts disposed in the first direction;
   a word line associated with each of the rows, each word line coupling data stored in the memory cells of one row to a plurality of bit line contacts, each word line being formed from a first conductive layer and disposed in the first direction;
   a shared power supply member coupled to the cells of the two rows, said shared power supply member being formed from a second conductive layer and providing a voltage potential to the memory cells, said shared power supply member being disposed in the first direction, and having a first portion disposed over, and making contact with, the power supply contacts, and a second portion offset with respect to the power supply contacts;
   a word line strap member associated with each word line, the word line strap members providing an activating potential to its respective word line, each word line strap member being formed from a third conductive layer, and being disposed in the first direction, over and offset from its respective word line; and
   a shared power supply strap member, the shared power supply strap member providing the voltage potential to the shared power supply member, the shared power supply strap member being formed from the third conductive layer, and being disposed in the first direction over, and making contact with, the second portion of said shared power supply member.

2. The static random access memory array of claim 1, including:
   a plurality of bit lines coupled to the bit line contacts, said bit lines being formed from a fourth conductive layer and being disposed in a second direction, perpendicular to the first direction.

3. The static random access memory array of claim 2, including:
   a plurality of bit line landing members, one bit line landing member being associated with one bit line contact and coupling its respective bit line contact to one bit line, the bit line landing members being formed from at least the third conductive layer.

4. The static random access memory array of claim 3, wherein:
   each bit line landing member includes a bit line contact landing member, each bit line contact landing member being associated with one bit line landing member and its associated bit line contact, and coupling its associated bit line contact to its associated bit line landing member, the bit line contact landing members being formed from the second conductive layer.

5. The static random access memory array of claim 1, wherein:
   the first and second conductive layers include doped polysilicon.

6. A semiconductor memory device array, comprising:
   a plurality of memory cells arranged in rows and columns, each memory cell including a first and second active device, each active device having a first terminal, second terminal, and third terminal, a current path between the second terminal and the third terminal being varied by a signal applied to the first terminal, the first terminal of the first device being coupled to the second terminal of the second device, the first terminal of the second device being coupled to the second terminal of the first device;
   a plurality of word lines, each word line being coupled to the first terminals of the memory cells common to one row;
   a plurality of shared power supply lines, each being coupled to the third terminals of memory cells common to two adjacent rows, said plurality of first power supply lines being generally parallel to said plurality of word lines;
   a plurality of word strapping lines, each being associated with one word line and being disposed over, and offset from its respective word line for substantially the entire array; and
   a plurality of shared power strapping lines, each being associated with one power supply line and being disposed over, and offset from the third terminals of the memory cells coupled to its respective first power supply line for substantially the entire array.

7. The semiconductor memory device array of claim 6, wherein:
each said active device is an insulated gate field effect transistor.

8. The semiconductor memory device array of claim 6, wherein:
said word strapping lines and said first power strapping lines are formed from the same conductive layer.

9. The semiconductor memory device array of claim 6, wherein:
said word lines are formed from a first layer of polysilicon.

10. A static random access memory (SRAM), comprising:
an array of SRAM including at least two adjacent rows and a plurality of columns of SRAM cells and at least two word lines, each coupled to the SRAM cells in one of said two adjacent rows, and a plurality of power supply terminals shared by said adjacent rows for supplying a power supply voltage to the SRAM cells in said adjacent rows;
a shared power supply conductor insulatively disposed in the direction of said adjacent rows over the array and being coupled to the plurality of power supply terminals, said shared power supply conductor supply power to SRAM cells of said adjacent rows.

11. The static random access memory of claim 10 wherein said shared power supply conductor includes a plurality of power supply contacts and a landing portion extending in the column direction away from the power supply contacts.

12. The static random access memory of claim 11 further comprising a shared power supply strap member insulatively disposed in the row direction over the array, said shared power supply strap member being coupled to said power supply contacts.

13. The static random access memory of claim 12 further comprising at least two word line strap members insulatively disposed in the row direction over the array, each word line strap member being coupled to at least one word line.

14. The static random access memory of claim 13, wherein said adjacent two rows include a plurality of adjacent SRAM pairs, and wherein said power supply terminals being disposed substantially therebetween.

15. The static random access memory of claim 14, wherein each of said power supply contacts being positioned substantially above one SRAM pair.

16. The static random access memory of claim 14, wherein:
the shared power supply conductor being disposed over the power supply terminals, the landing portions of the shared power supply conductor extending over the first row of said adjacent rows;
said word line strap members being offset with respect to the second row of said adjacent rows; and
said shared power supply strap member being disposed substantially over the landing portions of the shared power supply conductor.

17. The static random access memory of claim 10, wherein each of said SRAM cell includes a pair of cross-coupled, active devices.

18. The static random access memory of claim 17, wherein:
the pair of cross coupled active devices within each cell includes a first insulated gate field effect transistor (IGFET) and a second IGFET, the gate of the first IGFET being coupled to the drain of the second IGFET, the gate of the second IGFET being coupled to the drain of the first IGFET; and
said adjacent rows includes a first row of SRAM cells, substantially each SRAM cell in the first row being situated between a first adjacent SRAM cell and second adjacent SRAM cell, the source of the first IGFET of substantially each SRAM cell in the first row being formed in common with the source of the second IGFET of its respective first adjacent SRAM cell, the source of the second IGFET of substantially each SRAM cell in the first row being formed in common with the source of the first IGFET of its respective second adjacent SRAM cell, the common sources of the SRAM cells being the power supply terminals.

19. The static random access memory of claim 18, wherein said adjacent rows includes a second row of SRAM cells, substantially each SRAM cell in the second row being situated between a first adjacent SRAM cell and second adjacent SRAM cell, the source of the first IGFET of substantially each SRAM cell in the second row being formed in common with the source of the second IGFET of its respective first adjacent SRAM cell, the source of the second IGFET of substantially each SRAM cell in the second row being formed in common with the source of the first IGFET of its respective second adjacent SRAM cell, each common source of the second row being formed in common with at least one common source of the first row to form a plurality of first power supply terminals for the first and second rows.

20. A static random access memory (SRAM), comprising:
an array of SRAM cells formed in rows and columns of SRAM cells, each pair of adjacent rows sharing a plurality of power supply terminals for supplying a power supply voltage to said cells; and
a plurality of shared power supply conductors insulatively disposed in the direction of said rows over the array, each of said shared power supply conductors being associated with, and shared by, one pair of adjacent rows, each of said power supply conductors being coupled to the power supply terminals of the associated pair of adjacent rows to provide power to SRAM cells of said adjacent rows.

21. The static random access memory of claim 20 wherein each of said plurality of shared supply conductors includes a plurality of power supply contacts; and a landing portion extending in the column direction away from the power supply contacts.

22. The static random access memory of claim 21 further comprising a plurality of shared power supply strap members insulatively disposed in the row direction over the array, each first shared power supply strap member being coupled to at least one first power supply conductor.

23. The static random access memory of claim 22 further comprising a plurality of word line strap members insulatively disposed in the row direction over the array, each word line strap member being coupled to at least one word line.

24. The static random access memory of claim 23, wherein each pair of adjacent rows includes a plurality of adjacent SRAM row pairs, each SRAM row pair including a first row and a second row having common power supply terminal disposed substantially therebetween.

25. The static random access memory of claim 24, wherein:
each shared power supply conductor associated with each pair of adjacent rows being disposed over the power supply terminals of its respective SRAM row pair with the power supply contacts coupled thereto, the landing portions of the said power supply conductor extending over the first row of its respective SRAM row pair;

said plurality of word line strap members includes a first word line strap member and second word line strap member associated with the first row and second row of each SRAM row pair, the first and second word line strap members being offset with respect to the second row of its respective SRAM row pair; and said plurality of shared power supply strap members includes a shared power supply strap member associated with each SRAM row pair, each shared powers supply strap member being disposed substantially over the landing portions of the shared power supply conductor of its respective SRAM row pair, and including a plurality of power supply strap contacts coupled to said landing portions.

26. The static random access memory of claim 20, wherein each said SRAM cell includes a pair of cross-coupled, active devices.

27. The static random access memory of claim 26, wherein:

the pair of cross coupled active devices within each cell includes a first insulated gate field effect transistor (IGFET) and a second IGFET, the gate of the first IGFET being coupled to the drain of the second IGFET, the gate of the second IGFET being coupled to the drain of the first IGFET; and each adjacent pair of rows includes at least a first row of SRAM cells, substantially each SRAM cell in the first row being situated between a first adjacent SRAM cell and second adjacent SRAM cell, the source of the first IGFET of substantially each SRAM cell in the first row being formed in common with the source of the second IGFET of its respective first adjacent SRAM cell, the source of the second IGFET of substantially each SRAM cell in the first row being formed in common with the source of the first IGFET of its respective second adjacent SRAM cell, the common sources of the SRAM cells being the first power supply terminals.

28. The static random access memory of claim 26, wherein said each pair of adjacent rows includes at least a second row of SRAM cells, substantially each SRAM cell in the second row being situated between a first adjacent SRAM cell and second adjacent SRAM cell, the source of the first IGFET of substantially each SRAM cell in the second row being formed in common with the source of the second IGFET of its respective first adjacent SRAM cell, the source of the second IGFET of substantially each SRAM cell in the second row being formed in common with the source of the first IGFET of its respective second adjacent SRAM cell, each common source of the second row being formed in common with at least one common source of the first row to form a plurality of first power supply terminals for the first and second rows.

* * * * *